(12) United States Patent
Harrington

(10) Patent No.: US 9,456,535 B2
(45) Date of Patent: *Sep. 27, 2016

(54) RETROFIT AUTOMOBILE RADIO

(71) Applicant: Steven L. Harrington, Fullerton, CA (US)

(72) Inventor: Steven L. Harrington, Fullerton, CA (US)

(73) Assignee: Steven L. Harrington, Henderson, NV (US)

( * ) Notice: Subject to any disclaimer, the term of this patent is extended or adjusted under 35 U.S.C. 154(b) by 840 days.

This patent is subject to a terminal disclaimer.

(21) Appl. No.: 13/728,844

(22) Filed: Dec. 27, 2012

(65) Prior Publication Data

US 2014/0185263 A1    Jul. 3, 2014

(51) Int. Cl.
| | | |
|---|---|---|
| *H04B 5/00* | (2006.01) | |
| *H05K 13/00* | (2006.01) | |
| *H04B 1/08* | (2006.01) | |
| *B60R 11/02* | (2006.01) | |

(52) U.S. Cl.
CPC ........... *H05K 13/00* (2013.01); *B60R 11/0205* (2013.01); *H04B 1/082* (2013.01); *Y10T 29/49117* (2015.01)

(58) Field of Classification Search
CPC . B60R 11/0205; B60R 16/02; B60R 23/941; B60R 37/04; B60R 2011/0005; B60R 2011/0047; H04B 1/38; H04B 1/082; F16M 13/00; G12B 9/00; H05K 5/0017; H05K 5/02; H05K 11/02; H05K 13/00
USPC ............. 455/90.1, 90.3, 345, 346, 347, 348, 455/349, 351; 361/814, 816
See application file for complete search history.

(56) References Cited

U.S. PATENT DOCUMENTS

| | | | |
|---|---|---|---|
| 3,685,879 A | 8/1972 | Tsuji | |
| 3,906,371 A | 9/1975 | Tsuji | |
| 4,067,654 A | 1/1978 | Maniaci | |
| 4,436,350 A | 3/1984 | Jolin | |
| 4,445,228 A | 4/1984 | Bruni | |
| 4,562,595 A * | 12/1985 | Bauer | B60K 37/04 455/345 |
| 5,222,752 A | 6/1993 | Hewitt | |
| 5,637,928 A | 6/1997 | Nakajima et al. | |
| 5,771,305 A | 6/1998 | Davis | |
| 5,842,116 A * | 11/1998 | Nishida | H04B 1/08 361/814 |
| 6,747,364 B1 | 6/2004 | Shibuya et al. | |
| 7,734,276 B2 | 6/2010 | Harrington | |
| 8,305,773 B2 | 11/2012 | Snider et al. | |
| 2002/0131606 A1 | 9/2002 | Stanberry et al. | |
| 2005/0123148 A1 | 6/2005 | Ohler | |
| 2008/0287093 A1* | 11/2008 | Harrington | B60R 11/0205 455/345 |

* cited by examiner

*Primary Examiner* — Thanh Le
(74) *Attorney, Agent, or Firm* — Thorpe North & Western LLP

(57) ABSTRACT

A replacement radio which can be used to replace a wide range of older automobile radios and fit into an almost unlimited number of dashboard configurations comprises an interchangeable radio display assembly having a radio display sized to fit into an original automobile dashboard radio display opening and a separate radio case having radio electronics therein. The separate radio display assembly is operatively connected to the radio electronics in the radio case, such as by a cable extending between the two. Separate control knob shafts and associated controls can also be provided which are operatively connected to the radio, such as by cables. With a separate radio display assembly and separate control knob shafts, there is no limit to where the radio case can be placed with respect to the dashboard mounting the display and controls and a radio display assembly that fits the particular radio display opening can be used with the radio case.

19 Claims, 4 Drawing Sheets

RETROFIT AUTOMOBILE RADIO

BACKGROUND OF THE INVENTION

1. Field

The present invention relates generally to automobile radio receiver apparatus and particularly to after market radio receiver apparatus used to replace existing radio receiver apparatus in automobiles or other vehicles, such as trucks, all of which will hereinafter be referred to as automobiles or cars.

2. State of the Art

Radios have been a standard accessory in automobiles for decades and are generally mounted in the automobile dashboard. An automobile radio will generally include a radio case housing the radio electronics and having a display extending therefrom or mounted therein to display to a radio user the radio settings, and, particularly for older automobiles, the radio case will generally also have a pair of control knob shafts extending therefrom for mounting control knobs for controlling and changing radio settings, such as volume and radio station tuning.

Automobile radios, particularly automobile radios from the 1950's through the 1980's, generally have a faceplate forming the front of the radio case or mounted to the front of the radio case, with the radio display and the control knob shafts for the control knobs extending from the case or faceplate and with the radio case extending back from the faceplate. The control knob shafts will generally include threaded control knob shaft sleeves extending from the radio case through which the control knob shafts extend. To mount these radios in the dashboard of an automobile, the dashboard will generally provide a display opening to receive the radio display and radio control knob shaft openings to simultaneously receive the pair of radio control knob shafts with respective control knob shaft sleeves extending from the radio case or faceplate. The radio is then secured in the dashboard by nuts screwed onto the threaded control knob shaft sleeves from the front of the dashboard to secure the radio face plate and the radio case to the back of the dashboard. Thus, the dashboard is sandwiched between the radio case or faceplate and the nuts tightened onto the threaded control knob shaft sleeves, which securely hold the radio in place in the dashboard. When mounted in the dashboard, the radio display will fit into the display opening in a manner so that it can be seen by a user and the control knob shafts for the control knobs will extend through the control knob shaft openings and sleeves so that control knobs mounted on the shafts are accessible to a user to control the radio thus mounted. The radio case extends back from the faceplate behind the dashboard and is sized to fit into the space between the dashboard and the firewall. A back strap may sometimes also be used to secure and stabilize the back of the radio case in position behind the dashboard.

As indicated, automobile radios are generally mounted in automobile dashboards. However, each model of automobile generally has a different dashboard design with different space available behind the dashboard between the dashboard and the firewall or other equipment mounted behind the dashboard, such as heating and air conditioning system components. Usually dashboard designs change from year to year or at least every several years and with each new dashboard design, the size and placement of the radio display opening, the positioning of the control knob shaft openings for the radio, and the space between the dashboard and firewall and other equipment mounted behind the dashboard are changed. Thus, over the last fifty or more years, hundreds of different dashboards with different display opening configurations and locations and different control knob shaft opening placements have been produced. Generally, each of the different dashboard designs with different display opening configurations and locations and different control knob shaft opening placements were accompanied by a different radio specifically configured to fit the particular dashboard design. However, particular radios in the configurations to fit these many dashboards have long been out of production.

Radios do not last forever, and further, in recent years, there have been many improvements to automobile radios along with the inclusion of additional features such as, most recently, inputs for small portable digital memory storage devices such as Ipods, flash drives, and SD cards which can provide digital music files for playback through an automobile radio sound system. Many older automobile drivers and classic car owners wish to replace the original radio in their automobile with a new radio, either to provide a radio that works if the original radio has stopped working, or to provide a new radio with the additional features of more modern radios. Unfortunately, new original equipment replacement radios are not available for older cars, and further, new after market replacement radios to fit into the space available and having one of the many old dashboard radio configurations generally are not available.

There have been past attempts to provide replacement radios that provide adjustability of the spacing of the control knob shafts in order to allow the radio to fit a number of different dashboard radio mounting configurations, see for example, U.S. Pat. Nos. 4,067,654, 3,906,371, and 3,685,879, and my prior U.S. Pat. No. 7,734,276. However, while these systems provide for adjustment of the positioning of control knob shafts in order to fit a variety of control knob shaft opening positions, they do not address the problem of mounting a replacement radio where there is inadequate space behind the dashboard to receive the replacement radio.

The problem still exists of providing a replacement radio for older automobiles that will fit a wide range of older automobile dashboard arrangements and make replacement radios available for use with most older automobiles. The availability of replacement radios for older automobiles is becoming more of a problem as the number of particular older automobiles in need of such replacement radios becomes more limited. Thus, it is becoming almost impossible for some classic and antique car owners to find replacement radios for their cars.

SUMMARY OF THE INVENTION

According to the invention, a replacement radio which can be used to replace a wide range of older automobile radios and fit into an almost unlimited number of dashboard configurations comprises a radio case housing the radio electronics and a separate radio display assembly adapted to fit into selected dashboard radio display openings. The separate radio display assembly can be mounted to the front of the radio case or can be connected remotely to the radio electronics in the radio case by either a connecting cable or by wireless communication. Further, where the dashboard in which the radio display assembly is to be mounted includes control knob shaft openings separate from the display opening, as in most older automobiles, the radio can further include separate control knob shafts and associated control housings connected remotely to the radio electronics in the radio case by either a connecting cable or by wireless communication. Such connections of the separate control knob shafts and associated control housings to the radio electronics in the radio case can be either directly to the radio electronics or to the radio electronics through the radio display assembly. When using separate control knob shafts and associated control housings, the control knob shafts can be mounted using special mounting brackets such as disclosed in my referenced U.S. Pat. No. 7,734,276, incorporated herein in its entirety by reference, which can also be used to mount the radio display assembly in the dashboard radio display opening.

Several advantages are provided by the separate radio display assembly. In situation where the space available behind the dashboard is insufficient for mounting the radio case behind the radio display assembly in the dashboard, the radio case can be positioned remotely from the radio display assembly in a location where there is room to mount the radio case. This can be, for example, in a remote location behind the dashboard or in another location such as in the engine compartment or in the trunk. Another advantage is that a single radio case can be used with a variety of different radio display assemblies so that an appropriate radio display assembly can be selected to fit a particular arrangement of dashboard radio display openings. Rather than manufacturing and stocking a number of different radios to provide displays to fit a number of different dashboard radio display openings, e.g., to fit a number of different older model automobiles, a single radio case with radio electronics therein can be manufactured and stocked along with a number of different display assemblies to fit the different radio display opening sizes and arrangements in different model automobiles. The radio display assemblies will generally be less expensive than an entire radio with case and built in display would be. Also, the radio display assemblies are smaller and easier to stock than the entire radio case. The use of separate radio display assemblies allows availability of a larger number of display assemblies with increased likelihood that a display assembly will be available to fit into a particular older model automobile. The combination of the separate display assemblies and separate control knob shafts and associated control housings provides an extremely flexible system for providing replacement radios for older or limited production automobiles.

While the provision of a number of the special mounting brackets for the separate control knob shafts for selection by an installer of an appropriate mounting bracket for a particular dashboard configuration of control knob mounting shaft openings provides flexibility for the installer as described in my referenced U.S. Pat. No. 7,734,276, the provision of a number of different radio display assemblies to a dealer or other supplier of replacement radios so the dealer or other supplier can select an appropriate display assembly for a particular automobile in which the radio is to be mounted, provides flexibility to the dealer or other supplier to be able to supply a radio to fit a particular automobile. For example, a manufacturer or other supplier of replacement automobile radios can maintain a warehouse with a supply of the same radio cases having the same radio electronics therein along with a supply of a number of different radio display assemblies each adapted to connect to that same radio case. When a customer orders a replacement radio to fit a particular model older automobile, the supplier can drop ship a radio case and the specifically needed radio display assembly to the customer. Further, since each radio case and the radio electronics therein is the same, regardless of the particular radio display assembly used, manufacturing economies and efficiencies for the radio cases and electronics can be achieved.

BRIEF DESCRIPTION OF THE DRAWINGS

Additional features and advantages of the invention will be apparent from the detailed description which follows, taken in conjunction with the accompanying drawings, which together illustrate, by way of example, features of the invention; and, wherein.

Figure 1:
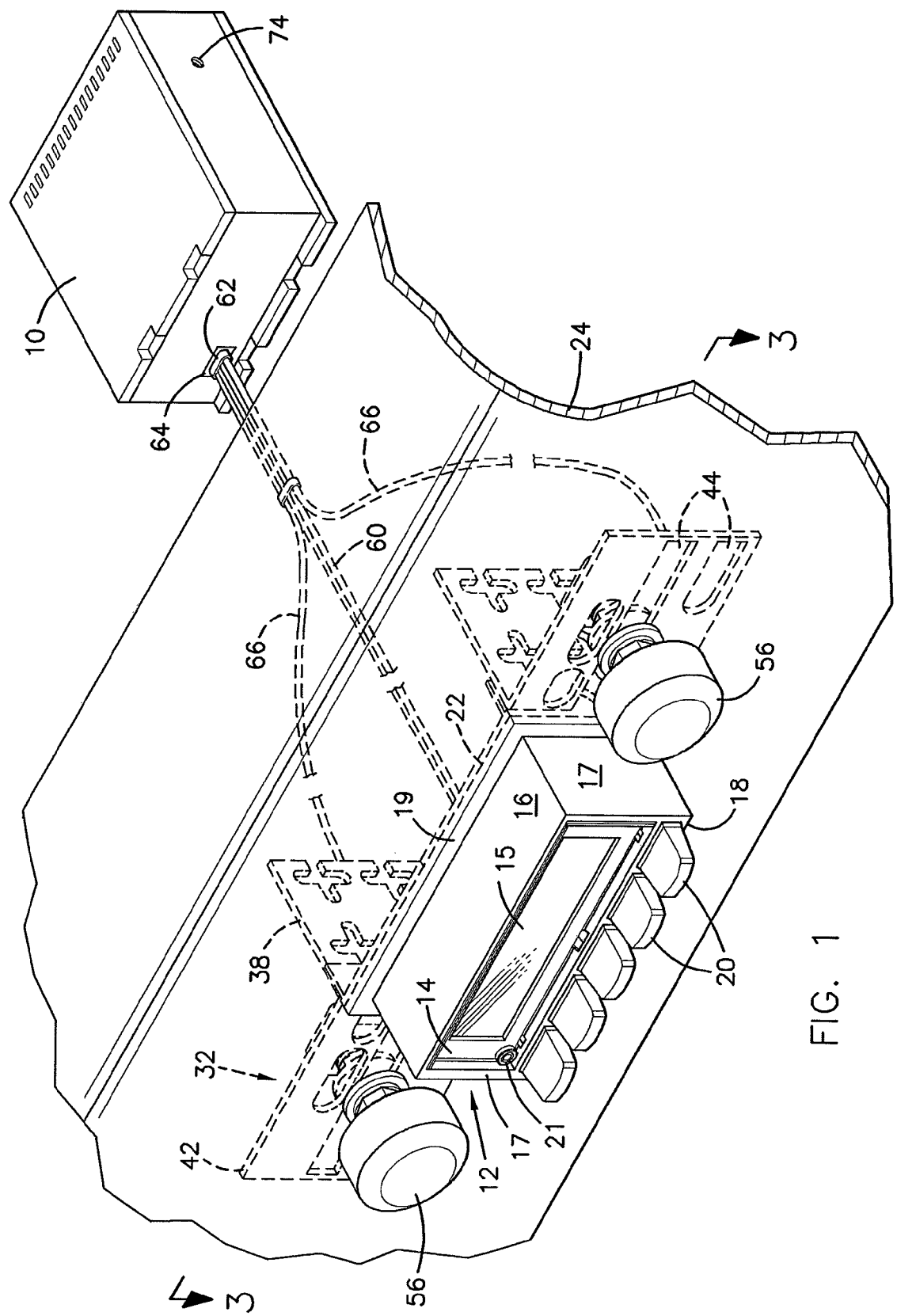
FIG. 1 is a fragmentary pictorial view of an automobile dashboard showing a front top left corner pictorial view of an example of a replacement automobile radio of the invention installed therein.

Reference will now be made to the exemplary embodiments illustrated, and specific language will be used herein to describe the same. It will nevertheless be understood that no limitation of the scope of the invention is thereby intended.

DETAILED DESCRIPTION OF EXAMPLE EMBODIMENTS

An example of a replacement retrofit radio of the invention is shown in FIGS. 1-4 and includes radio electronics within a radio case 10. A separate radio display assembly 12 includes a front 14 with display window or screen 15, a top 16, opposite sides 17, and a bottom 18, which extend from a mounting plate 19. Control buttons 20 extend through front 14 below display window 15. Buttons 20 can be used for various function controls, for example, for switching between preset radio stations. The replacement radio can include various functions, such as the ability to play digital music files, that did not exist in the original radio that the replacement radio is replacing. In addition to buttons 20, the radio display assembly 12 can also include other control buttons, not shown, for controlling radio functions, and one or more input and/or output jacks, such as shown at 21, for connecting various portable sound source devices, such as digital memory storage devices such as Ipods, flash drives, and SD cards. The buttons 20, and any other control buttons and/or input jacks and/or output jacks can be located in any desired position in radio display assembly 12.

The radio display assembly 12 is sized so as to fit into a dashboard radio display opening 22, in dashboard 24, for which the replacement radio display assembly 12 will be expected to fit. The radio display assembly 12 does not have to fit exactly into the dashboard display opening, and to provide versatility to the faceplate, it can be sized to fit into the smallest expected size of dashboard display opening for which the particular radio display assembly 12 will be expected to fit. Therefore, although the radio display assembly 12 is shown as coextensive with and filling the entire dashboard radio display opening 22, the radio display assembly 12 may be configured to be smaller in size in relation to the dashboard display opening 22 so will fill only a portion of the dashboard display opening. In such cases where the radio display assembly 12 will be sized to fit into the smallest expected dashboard display opening, there will be some dashboard display openings that will be larger than the radio display assembly 12. Where the radio display assembly 12 is smaller than the dashboard display opening into which it is placed, various types of fillers or covers, not shown, can be used to fill or cover the area between the edges of the radio display assembly 12 and the edges of the dashboard display opening into which the radio display assembly 12 is inserted.

Most older automobile radios also included a pair of control knob shafts with threaded control knob shaft sleeves extending from the radio case or from a radio faceplate to extend through separate control shaft openings through the dashboard. To mount these older radios in the dashboard of an automobile, the dashboard will generally provide a display opening to receive the radio display and radio control knob shaft openings to simultaneously receive the pair of radio control knob shafts with respective threaded control knob shaft sleeves extending from the radio or radio faceplate. The radio is then secured in the dashboard by nuts screwed onto the threaded radio control knob shaft sleeves from the front of the dashboard to secure the radio case or the radio faceplate with the radio case extending rearwardly therfrom to the back of the dashboard. Thus, the dashboard is sandwiched between the radio case or the radio faceplate and the nuts tightened onto the threaded control knob shaft sleeves, which securely hold the radio in place in the dashboard.

Since the replacement radio of the invention is to provide an appearance similar to the original radio it is replacing, where the original radio had radio control knob shafts extending through radio control knob shaft openings in the dashboard, the replacement radio of the invention will also provide radio control knob shafts to extend through the radio control knob shaft openings in the dashboard. To provide the control knob shafts, the radio display assembly can be configured similarly to a radio faceplate so that the radio display and the control knob shafts all extend from the radio display assembly. However, to increase the flexibility of the placement of the radio control knob shafts with respect to the radio display assembly, thereby allowing the same radio display assembly to be used with various different control knob shaft opening positions, separate control knob shafts and associated control housings and special mounting brackets as described in my referenced U.S. Pat. No. 7,734,276 can be used with the radio display assembly of the invention and will be shown and described as used with the example embodiment of radio display assembly 12 of the invention.

Figure 2:
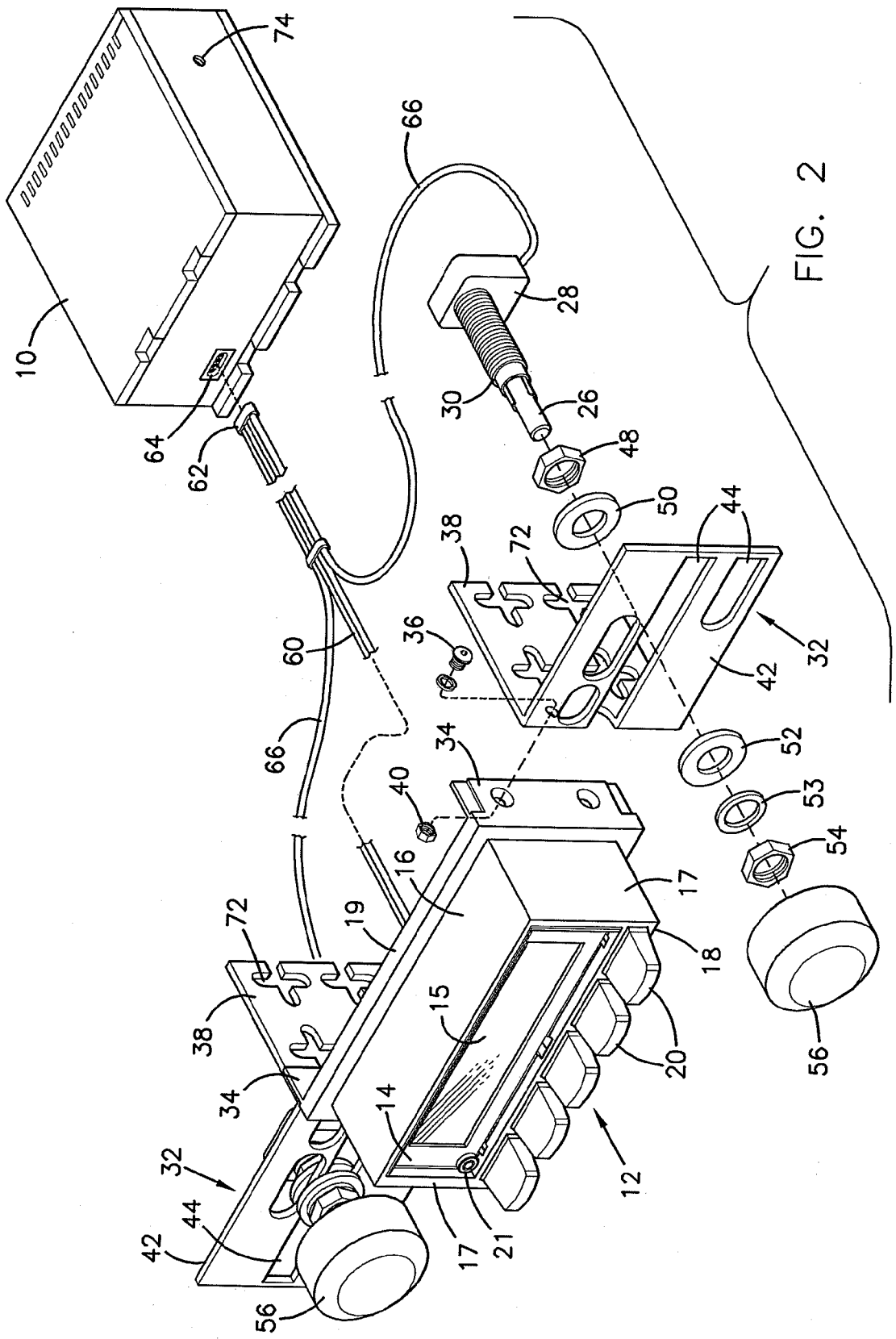
FIG. 2 is a similar pictorial view showing the closer mounting bracket and control knob mounting shaft in assembly view.
Figure 3:
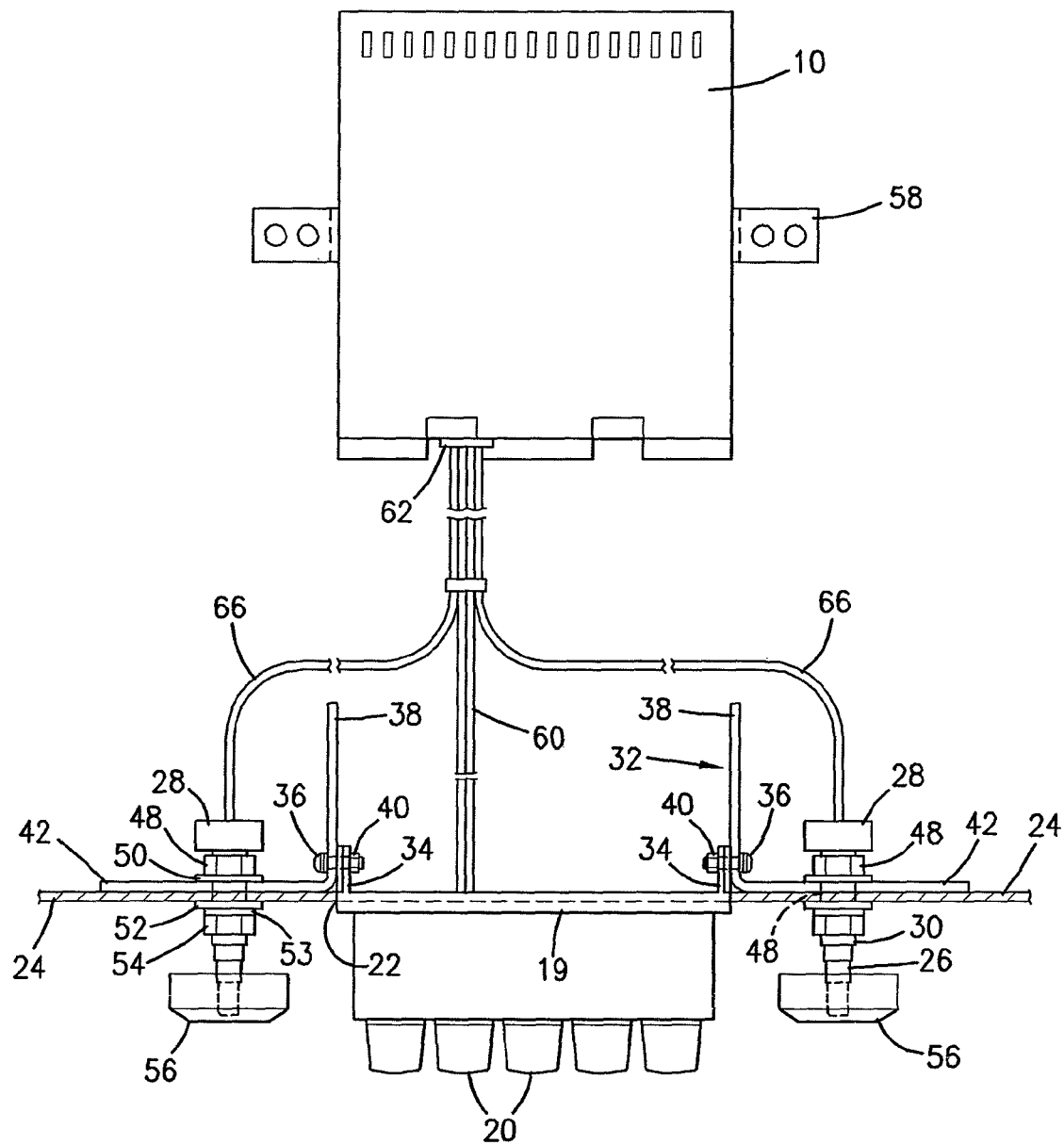
FIG. 3 is a top plan view of the radio of FIGS. 1 and 2 installed in a dashboard with the radio case mounted remotely from the display assembly.
Figure 4:
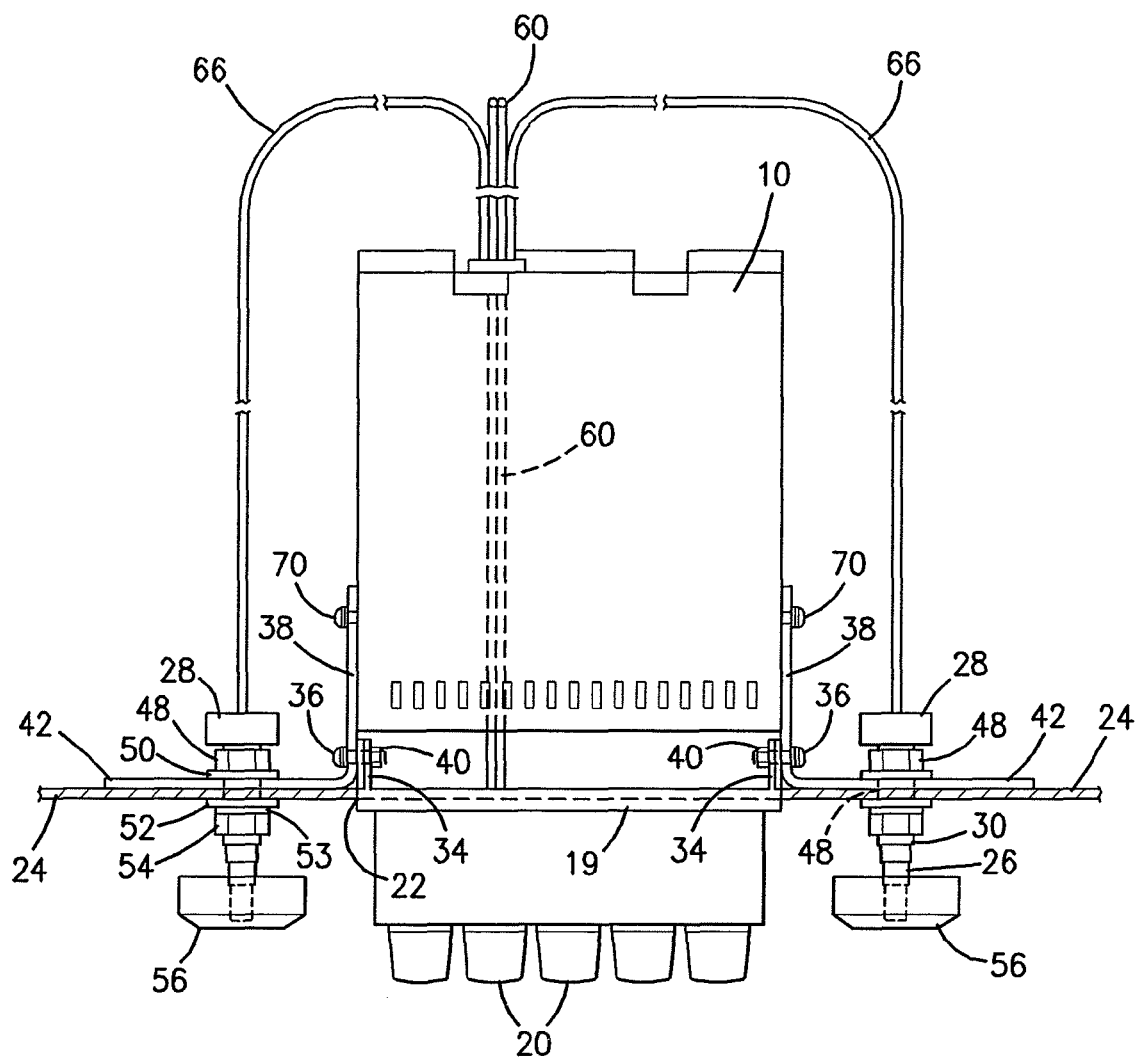
FIG. 4 is a top plan view of the radio of FIGS. 1 and 2 installed in a dashboard with the radio case mounted to the back of the radio display assembly.

As best seen in FIG. 2, separate control knob shafts 26 extend from associated control housings 28 and have a threaded sleeve 30 around the portion of the control knob shaft 26 as it extends from the control housing 28. L brackets 32 are attached to opposite sides 34 of radio display assembly mounting plate 19 by, for example, screws 36 extending through legs 38 of brackets 32 and respective mounting plate sides 34 into nuts 40. Leg 42 of each L bracket 32 extends outwardly from the front of radio display assembly mounting plate 19. As shown, the legs 42 extend from the front of mounting plate 19 in opposite directions. These bracket legs 42 mount control knob shaft threaded sleeves 30 which then are used to mount the radio display assembly 12 in the dashboard 24. Bracket legs 42 include slots 44 which slidingly receive shaft sleeves 30 therein so that shaft sleeves 30 and control knob shafts 26 can be adjustably positioned at any location along the slots 44. Various alternate slot configurations can be used, such as the slot configurations as shown in referenced U.S. Pat. No. 7,734,276. To install the radio display assembly into the dashboard 24, a set of L brackets 32 is selected to be attached to the radio display assembly mounting plate 19 that will allow the proper spacing and positioning of the control knob shafts 26 with respect to the radio display assembly 12 so that when the radio display assembly 12 is positioned in the dashboard radio display opening 22, the control knob shafts 26 will be positioned in alignment with dashboard radio shaft openings 46, FIGS. 3 and 4, provided in the particular dashboard 24. Control knob shafts 26 and threaded shaft sleeves 30 are extended through dashboard radio shaft openings 46. Before extending shafts 26 through dashboard radio shaft openings 46, nuts 48 are screwed onto threaded sleeves 30, FIG. 2, and are positioned on sleeve 30 so as to adjust the amount of extension of shafts 26 beyond the front of dashboard 24. Washers 50 are placed on threaded sleeves 30 and the shafts 26 with threaded sleeves 30 are then inserted through the slots 44 in bracket legs 42 and through dashboard radio shaft openings 46 in dashboard 24 so that washers 50 abut against the back surface of bracket legs 42. With the shafts 26 and sleeves 30 extending through dashboard radio shaft openings 46, washers 52 and 53 are placed on sleeves 30 in front of dashboard 24 and nuts 54 are tightened onto sleeves 30 to sandwich dashboard 24 against bracket leg 42 between nuts 48 and 54. This mounting allows for mounting of the shafts 26 on various thicknesses of dashboards 24. Because the bracket leg 42 is sandwiched against the back of dashboard 24 securely between nuts 48 and 54, and because bracket 32 is attached to radio display assembly 12, radio display assembly 12 is securely attached to the dashboard 24. To complete the installation, knobs 56 are pushed onto the ends of shafts 26. With the control knob shafts and associated control housings completely separate from the radio display assembly, they are free to be moved and positioned as necessary to fit into various arrangements of receiving dashboard shaft openings.

Radio electronics are housed in a radio case 10, which, as shown, is separate from and may be located remote from, the radio display assembly 12. This allows the radio case 10 with the radio electronics housed therein to be spaced from and mounted separately from the radio display assembly 12. The two are operatively connected, such as by a connecting cable 60 which extends from radio display assembly 12 to radio case 10. At least one end of connecting cable 60 has a plug 62 which can be plugged into a receiving socket 64, shown here in radio case 10. A similar plug can be located at the opposite end of connecting cable 60 to be received by a receiving socket in the radio display assembly 12, or cable 60 may be connected directly to radio display assembly 12. With this arrangement of the separate radio display assembly 12 for mounting in the automobile dashboard and the separate radio case 10, the radio case 10 can be mounted in any desired location where there is space for its mounting. This means that a replacement radio display assembly 12 which matches the appearance of the original radio faceplate in a particular vehicle can be mounted in the dashboard of the vehicle, and if the new replacement radio case 10 does not fit into the space immediately behind the radio display assembly 12 in the dashboard, the radio case can be mounted elsewhere where there is room for mounting. FIG. 3, which shows the radio case remote from the radio display assembly, shows a mounting strap 58 which can be used in mounting the radio case in a desired location. However, various ways of mounting the radio case 10 in a desired location can be used.

With the control knob shafts 26 and associated control housings 28 separate from the radio case 10 and from the radio display assembly 12, connecting cables 66, extend from each control housing 28 to radio case 10 to operatively connect the controls in control housing 28, which are operated by control knobs 56 and control knob shafts 26, to the radio electronics in radio case 10. The connecting cables 66 can be permanently connected into the radio within case 10, or can be removably connected through a plug on the end of each connecting cable to receiving sockets in radio case 10. While each of the connecting cables 66 from control housings 28 can be separately connected to radio case 10 with separate plugs and sockets, it has been found convenient to connect connecting cables 66 from each of the control housings 28 together along with connecting cable 60 from the radio display assembly for at least the portion of the cables toward the radio case 10, as shown, and providing a single plug 62 and socket 64 for attachment of the cables to the radio case 10. This keeps the cables together for neater wiring from the radio display assembly and control housings, which are installed in relatively close proximity, to the radio case, which may be remotely located. The various connecting cables 60 and 66 are separated near the ends thereof which connect to the radio display assembly 12 and the separate control housings 28 so that connection to the various spaced components is not interfered with. While the cables 66 are shown connected directly to the control housings 28, end plugs and receiving sockets can be provided so the respective cables 66 can be connected and disconnected at control housings 28. Further, while cables 66 are shown connecting control housings 28 to radio case 10, the cables 66 can extend from control housings 28 to radio display assembly 12 with the control signals from control housings 28 relayed from radio display assembly 12 to radio case 10 through connecting cable 60 extending between radio display assembly and radio case 10. Any desired number of conductors can be included in cables 60 and 66 as necessary to transmit the required signals between the components. Alternately, rather than connecting the components with connecting cables, the connections could be done through wireless communication.

In situations where there is room for the radio case 10 behind the radio display assembly behind the dashboard, the radio case 10 can be mounted immediately behind the radio display assembly 12 as shown in FIG. 4. In the example mounting shown, the L bracket legs 38 extend rearwardly of the attachment to the radio display assembly 12. The radio case 10 is shown having a width approximately equal to the width of the display assembly so can fit closely between the extensions of the bracket legs 38 and be secured to the L bracket legs 38, such as by screws 70 extending through end mounting openings 72 in L bracket legs 38, and into screw receiving holes 74 provided in the sides of the radio case 10. Again, various ways of mounting radio case 10 behind the dashboard and directly behind the display assembly can be used. For example, if the radio case is smaller in width than the space between the L bracket legs 38, additional brackets can be used to attach the radio case to the L bracket legs 38. Further, while the radio case 10 is shown in FIG. 4 as oriented so that cables 60 and 66 plug into the case 10 at the rearward end of the case, which provides additional room for attaching the cables, the radio case can be oriented so the cables are attached between the display assembly and the radio case 10.

While the forgoing examples are illustrative of the principles of the present invention in one or more particular applications, it will be apparent to those of ordinary skill in the art that numerous modifications in form, usage and details of implementation can be made without the exercise of inventive faculty, and without departing from the principles and concepts of the invention. Accordingly, it is not intended that the invention be limited, except as by the claims set forth below.

The invention claimed is:

1. A retrofit radio for replacing an original vehicle radio in an original vehicle dashboard having an original radio display opening, comprising:
   a radio display assembly having a radio display sized to fit into the original radio display opening and controls for controlling the radio;
   means for securing, the radio display assembly in the vehicle dashboard with the radio display in the original radio display opening;
   a radio case separate from the radio display assembly having radio electronics therein; and
   means for operatively and remotely connecting the radio display assembly to the radio electronics in the radio case.

2. The retrofit radio of claim 1, wherein the means for securing the radio display assembly in the vehicle dashboard comprises at least one mounting bracket attachable to the radio display assembly and to the dashboard.

3. The retrofit radio of claim 2, wherein the at least one bracket is two brackets, each bracket attachable to an opposite side of the radio display assembly.

4. The retrofit radio of claim 1 wherein the means operatively connecting the radio display assembly to the radio electronics in the radio case is a length of electrical cable.

5. The retrofit radio of claim 4, wherein the length of electrical cable connects to the radio electronics in the radio case via a plug at an end of the electrical cable and a socket mounted in the radio case.

6. The retrofit radio of claim 1, wherein the original vehicle dashboard into which the retrofit radio is installed includes a plurality of original radio control element openings, and wherein the retrofit radio additionally includes a plurality of radio control elements separate from the radio display assembly and the radio case, means for mounting the separate radio control elements in the original radio control element openings; and means for operatively and remotely connecting the separate radio control elements to the radio electronics in the radio case.

7. The retrofit radio of claim 6, wherein the means for securing the radio display assembly in the vehicle dashboard comprises at least one mounting bracket attachable to the radio display assembly and attachable to a separate radio control element.

8. The retrofit radio of claim 7, wherein the plurality of separate radio control elements is two separate radio control elements, and wherein the at least one bracket is two brackets, each bracket attachable to an opposite side of the radio display assembly and to a different one of the two separate radio control elements.

9. The retrofit radio of claim 8, wherein each of the separate radio control elements includes a control knob shaft and a shaft sleeve adapted to extend through one of the plurality of original radio control element openings and wherein each of the brackets includes an opening through which the control knob shaft and a shaft sleeve of one of the control elements is adapted to extend prior to extending through one of the plurality of original radio control element openings.

10. The retrofit radio of claim 9, wherein the one or more mounting brackets is an L-bracket, one leg of the L-bracket adapted to be attached to a side of the radio display assembly and the other leg of the L-bracket having the opening through which the control knob shaft and shall sleeve of one of the control elements is adapted to extend.

11. A replacement vehicle radio to replace an original vehicle radio mounted in a vehicle dashboard having a dashboard radio display opening and a plurality of dashboard radio control knob shaft openings separate from the radio display opening, the original vehicle radio having an original radio case, an original radio display fitting into the dashboard radio display opening and a plurality of original radio control knob shafts extending from the original radio case through the dashboard radio control knob shall openings in the vehicle dashboard, and by which the original radio can be mounted to the dashboard, comprising:
  a replacement radio case having replacement radio electronics therein;
  a replacement radio display assembly separate from the radio case having a replacement radio display sized to fit into the dashboard display opening in which it is expected the replacement radio will be placed;
  a plurality of separate replacement radio control housings separate from the replacement radio case and replacement radio display assembly, each replacement radio control housing having a radio control knob shaft sized and configured to lit through one of the plurality of original dashboard radio control knob shaft openings in the vehicle dashboard;
  means operatively connecting the replacement radio display assembly and the plurality of replacement radio control housings to the replacement radio electronics in the replacement radio case; and
  mounting means for attaching the replacement radio display assembly and the replacement radio control housings in the vehicle dashboard.

12. A replacement vehicle radio according to claim 11, wherein the means operatively connecting the replacement radio display assembly and the plurality of replacement radio control housings to the replacement radio electronics in the replacement radio case are lengths of electrical cable.

13. A replacement vehicle radio according to claim 12, wherein a separate length of electrical cable connects the replacement radio display assembly and each of the replacement radio control housings of the plurality of replacement radio control housings to the replacement radio electronics in the replacement radio case.

14. A replacement vehicle radio according to claim 11, wherein each of the radio control knob shafts includes a threaded radio control knob shaft sleeve adapted to extend through one of the plurality of original dashboard radio control knob shaft openings along with the control knob shaft, and wherein respective radio control knob shafts are secured in the dashboard radio control knob shaft openings by a control knob shaft sleeve nut screwed onto the threaded radio control knob shaft sleeve.

15. A replacement vehicle radio according to claim 14, additionally including, a control knob shaft sleeve spacing nut threaded onto the control knob shall sleeve, wherein the radio control knob shafts are secured in the dashboard radio control knob shaft openings by sandwiching the dashboard between the control knob shaft sleeve spacing nuts and the radio control knob shaft sleeve nuts screwed onto the threaded control knob shall sleeves.

16. A replacement vehicle radio according to claim 15, wherein the means for attaching the replacement radio display assembly in the vehicle, dashboard includes mounting brackets attached to the replacement radio display assembly; and wherein the mounting brackets are sandwiched along with the dashboard between the control knob shaft sleeve spacing nuts and the control knob shaft sleeve nuts screwed onto the threaded radio control knob shaft sleeves to thereby attach the replacement radio display assembly to the dashboard.

17. A replacement vehicle radio according to claim 11, wherein the means for attaching the replacement radio display assembly in the vehicle dashboard includes mounting brackets attached to the replacement radio display assembly; and wherein the mounting brackets are coupled to the radio control knob shafts and are secured to the dashboard along with the radio control knob shafts to thereby attach the replacement radio display assembly to the dashboard.

18. A method of replacing an original vehicle radio in an original vehicle dashboard having an original radio display opening, comprising:
  obtaining a radio display assembly having a radio display sized to lit into the original radio display opening and controls for controlling the radio;
  securing the radio display assembly in the vehicle dashboard with the radio display in the original radio display opening;
  obtaining a radio case separate from the radio display assembly, said radio case having radio electronics therein:
  securing the radio case having the radio electronics therein in the vehicle; and
  operatively connecting the radio display assembly to the radio electronics in the radio case.

19. A method of replacing an original vehicle radio in an original vehicle dashboard having, an original radio display opening according to claim 18, wherein the dashboard also has a plurality of original dashboard radio control knob shaft openings, further comprising the steps of:
  obtaining a plurality of radio control elements separate from the radio display assembly and the radio case, each radio control element having a radio control knob shaft sized and configured to fit through one of the plurality of dashboard radio control knob shaft openings in the vehicle dashboard;
  mounting the separate radio control elements in the radio control knob shaft openings; and
  operatively connecting each separate radio control element to the radio electronics in the radio case.

* * * * *